(12) United States Patent
Lee

(10) Patent No.: US 12,113,540 B2
(45) Date of Patent: Oct. 8, 2024

(54) OPTICAL TIME SYNCHRONIZATION

(71) Applicant: DENSO International America, Inc., Southfield, MI (US)

(72) Inventor: Daniel Lee, East Salt Lake City, UT (US)

(73) Assignee: DENSO International America, Inc., Southfield, MI (US)

( * ) Notice: Subject to any disclaimer, the term of this patent is extended or adjusted under 35 U.S.C. 154(b) by 28 days.

(21) Appl. No.: 17/980,663

(22) Filed: Nov. 4, 2022

(65) Prior Publication Data

US 2023/0147661 A1    May 11, 2023

Related U.S. Application Data

(60) Provisional application No. 63/276,201, filed on Nov. 5, 2021.

(51) Int. Cl.
| | |
|---|---|
| G05F 1/06 | (2006.01) |
| G06F 1/06 | (2006.01) |
| G06F 1/12 | (2006.01) |
| H03K 4/94 | (2006.01) |
| H03L 7/099 | (2006.01) |

(52) U.S. Cl.
CPC ............... H03L 7/099 (2013.01); G06F 1/06 (2013.01); G06F 1/12 (2013.01); H03K 4/94 (2013.01)

(58) Field of Classification Search
CPC ... H03L 7/099; H03L 7/00; G06F 1/06; G06F 1/12; G06F 1/105; G06F 1/04; H03K 4/94

See application file for complete search history.

(56) References Cited

U.S. PATENT DOCUMENTS 5,761,430 A     6/1998  Gross et al.
10,090,992 B2 * 10/2018  Polster ................ H03K 3/0315

* cited by examiner

Primary Examiner — Jung Kim
(74) Attorney, Agent, or Firm — Warner Norcross + Judd LLP (57) ABSTRACT

A system and method for synchronizing clocks. The system may include a master device having a reference clock and slave devices whose clocks may be synchronized with the reference clock. The master device may drive a light transmitter (e.g., LED) to produce a light pulse with each clock cycle of the reference clock. The light pluses may be distributed by a transmissive medium, such as a low cost optical fiber.

18 Claims, 5 Drawing Sheets

OPTICAL TIME SYNCHRONIZATION

FIELD OF THE INVENTION

The present application relates to a system and method for synchronizing time between devices, and particularly toward synchronizing time between devices in a low cost, precise manner.

BACKGROUND

There are many applications that require precise timing synchronization. This is often accomplished by using expensive coax cable and circuitry. Further, such conventional systems are often susceptible to interference, such as fast switching circuitry and RF communications.

Precision clocks are often used as a foundation for measurements obtained in real-time location systems. A conventional real-time location system, however, includes multiple devices disposed at different areas of an object with each device operating in accordance with its own clock. Although these clocks may be considered precise on an individual basis, there are frequency deviations among the clocks. Such deviations may be the result of inherent differences between the clock circuitry including tolerance differences between oscillators that are the same type (e.g., the same part number). Deviations may occur during operation as well—for example, a particular type of oscillator may be specified with a frequency stability of 10 parts per million (PPM). This means that, given an oscillator having an output frequency of 1 MHz, the frequency of the oscillator may vary by 5 Hz. With multiple oscillators in a real-time system, the actual frequencies of the oscillators are likely different from each other. These differences can adversely affect analysis of measurements in the real-time location system for determining a location of a device relative to an object.

SUMMARY

A system and method are provided for substantially locking an oscillator output to a reference oscillator output. In one embodiment the frequency of the oscillator output may be substantially locked to the frequency of the reference oscillator output via transmission of light energy corresponding to the reference oscillation output.

In general, one innovative aspect of the subject matter described herein can be a system for generating a clock signal in a device. The system may include an optical receiver configured to receive light energy corresponding to a reference oscillation signal, where the optical receiver may be operable to generate a receiver output based on the light energy. The system may include an oscillator configured to generate an oscillating signal, where the oscillator may be operably coupled to the receiver output of the optical receiver. The oscillating signal of the oscillator may be substantially locked to the reference oscillation signal received via the optical receiver.

The foregoing and other embodiments can each optionally include one or more of the following features, alone or in combination. In particular, one embodiment includes all the following features in combination.

In some embodiments, the system may include an amplifier operably coupled to the oscillator, where the amplifier may be configured to generate the clock signal based on the oscillating signal generated by the oscillator.

In some embodiments, the amplifier may include a first amplifier stage directly connected to the oscillator and configured to generate a first amplifier output based on the oscillating signal. The amplifier may include a second amplifier stage coupled to the first amplifier stage and configured to generate a second amplifier output based on the first amplifier output such that the second amplifier output is based on the oscillating signal.

In some embodiments, the oscillator and the amplifier may form a super-regenerative receiver with respect to the receiver output that is based on the reference oscillation signal.

In some embodiments, the oscillator may be a crystal oscillator.

In some embodiments, a mechanical vibration of the crystal oscillator may be varied based on the receiver output such that the mechanical vibration of the crystal oscillator is locked to the reference oscillation signal.

In some embodiments, the system may include a reference oscillator may be operable to generate the reference oscillation signal. The system may include an optical transmitter operably coupled to the reference oscillator, where the optical transmitter may be arranged to generate the light energy corresponding to the reference oscillation signal. The optical receiver and the oscillator may be disposed in the device, and the reference oscillator and the optical transmitter may be disposed in a remote device that is remote from the device, the optical receiver, and the oscillator.

In some embodiments, the system may include a fiber medium operably coupled between the optical transmitter and the optical receiver.

In some embodiments, the oscillating signal of the oscillator may be substantially locked to the reference oscillation signal in an open loop manner such that the reference oscillator is unaffected by operation of the oscillator.

In some embodiments, the system may include a slave device including the optical receiver and the oscillator, and where the system may include a plurality of such slave devices each capable of locking with the reference oscillation signal.

In general, one innovative aspect of the subject matter described herein can be embodied in a slave device that is remote from a master device. The slave device may include an optical receiver configured to receive light energy corresponding to a reference oscillation signal generated by the master device. The optical receiver may be operable to generate a receiver output based on the light energy. The slave device may include an oscillator configured to generate an oscillating signal, where the oscillator may be operably coupled to the receiver output of the optical receiver. The oscillating signal of the oscillator may be substantially locked to the reference oscillation signal received via the optical receiver and generated remotely from the optical receiver.

The foregoing and other embodiments can each optionally include one or more of the following features, alone or in combination. In particular, one embodiment includes all the following features in combination.

In some embodiments, the slave device may include an amplifier operably coupled to the oscillator. The amplifier may be configured to generate a clock signal based on the oscillating signal generated by the oscillator.

In some embodiments, the amplifier may include a first amplifier stage directly connected to the oscillator and configured to generate a first amplifier output based on the oscillating signal. The amplifier may include a second amplifier stage coupled to the first amplifier stage and configured to generate a second amplifier output based on the first amplifier output such that the second amplifier output is based on the oscillating signal.

In some embodiments, the oscillator and the amplifier may form a super-regenerative receiver with respect to the receiver output that is based on the reference oscillation signal.

In some embodiments, the oscillator may be a crystal oscillator.

In some embodiments, a mechanical vibration of the crystal oscillator is varied based on the receiver output such that the mechanical vibration of the crystal oscillator is locked to the reference oscillation signal.

In some embodiments, the optical receiver may be operably coupled to a fiber medium to receive the light energy transmitted by the master device.

In some embodiments, the oscillating signal of the oscillator may be substantially locked to the reference oscillation signal in an open loop manner such that the reference oscillation signal is unaffected by operation of the oscillator.

In general, one innovative aspect of the subject matter described herein can be embodied in a method of synchronizing an oscillation signal to a reference oscillation signal that is generated remotely from the oscillation signal. The method may include receiving light energy corresponding to the reference oscillation signal, and generating a receiver output based on the light energy. The method may include substantially locking an oscillator signal to the reference oscillation signal.

The foregoing and other embodiments can each optionally include one or more of the following features, alone or in combination. In particular, one embodiment includes all the following features in combination.

In some embodiments, the method may include amplifying the oscillator signal to yield a clock signal.

In some embodiments, the method may include generating the oscillator signal via a crystal oscillator.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION

In one embodiment, a system and method for synchronizing clocks is provided. The system may include a master device having a reference clock and slave devices whose clocks may be synchronized with the reference clock. The master device may drive a light transmitter (e.g., LED) to produce a light pulse with each clock cycle of the reference clock. The light pluses may be distributed by a transmissive medium, such as a low cost optical fiber. In the slave device, a light receiver (e.g., a photo diode) may be used to convert the light pluses into current pulses. These current pluses may be feed into an oscillator of the slave device (e.g., a crystal oscillator), which is configured to operate as a super-regenerative receiver that locks the oscillator onto the incoming signal that corresponds to the reference clock.

One embodiment according to the present disclosure may provide a very low cost method to keep the reference clocks of two different circuits in sync at a distance by using light pluses through low cost fiber optic cable, with a minimum or reduced level circuitry. In one embodiment, a frequency of multiple oscillators may be substantially aligned despite the oscillators having inherent differences that would otherwise yield a degree of misalignment. As an example, two 10 PPM oscillators may be aligned in accordance with one embodiment of the present disclosure to achieve a degree of frequency alignment that is not available in a conventional separate oscillator system without two much more expensive and bulky oscillators, each having a much better frequency stability of at least 1 parts per billion (PPB). 10 PPM oscillators are significantly more compact and less expensive relative to 1 PPB oscillators.

I. Optical Synchronization System

Figure 1:
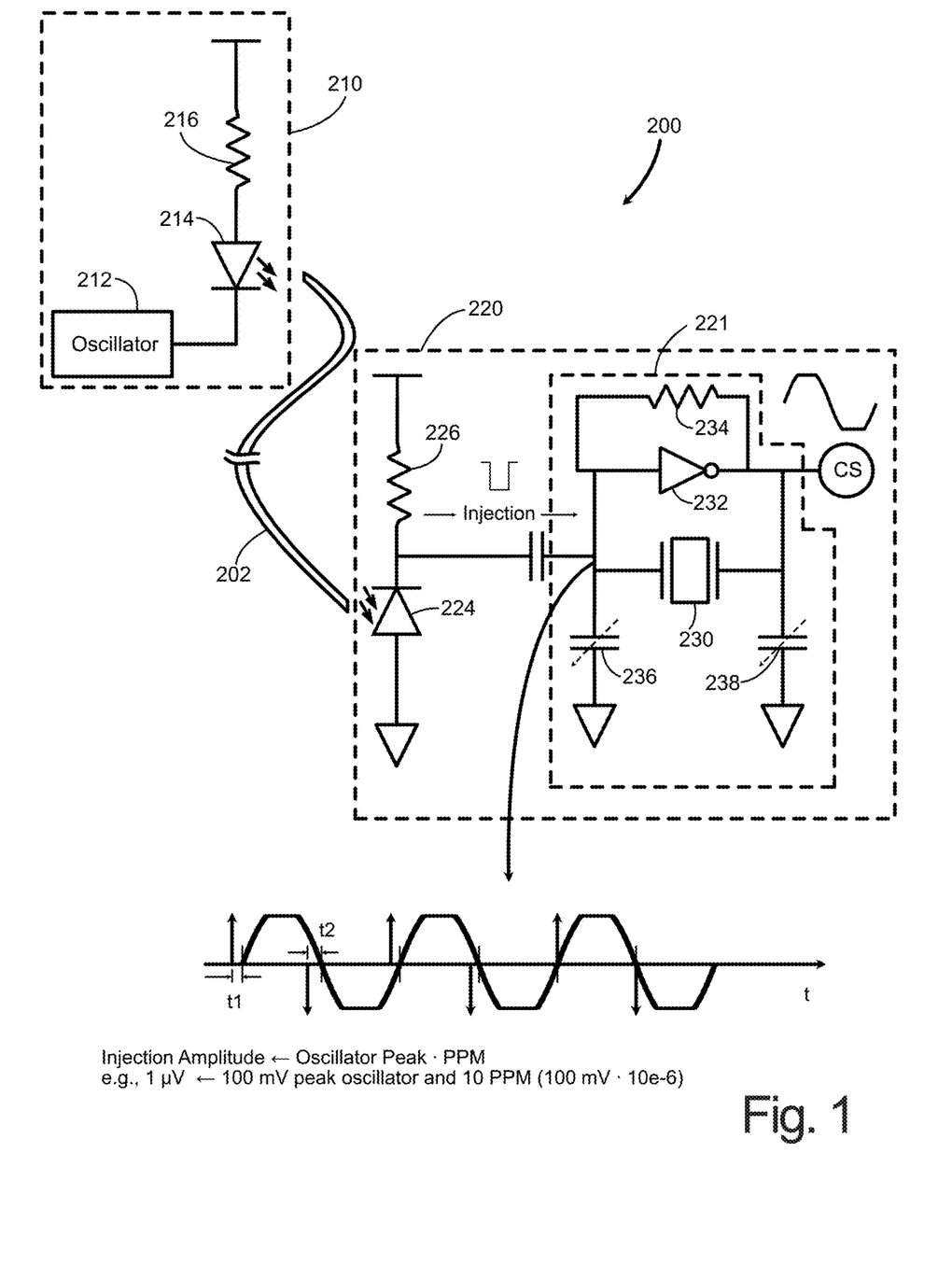
FIG. 1 shows a system in accordance with one embodiment.

A system for substantially locking an oscillator output to a reference oscillator output is shown in the illustrated embodiment of FIG. 1 and is generally designated 200. In the illustrated embodiment, the frequency of an oscillator output may be substantially locked to the frequency of a reference oscillator output via transmission of light energy corresponding to the reference oscillation output.

The system 200 in the illustrated embodiment includes a master device 210 and a slave device 220. The master device 210 may be configured to transmit light energy based on a reference oscillation signal generated by an oscillator 212. The slave device 220 may be operable to receive the light energy transmitted from the master device 210. The master device 210 may include a light transmitter 214, such as a laser diode operable to transmit light energy in accordance with the reference oscillation signal output from the reference oscillator 212. The light transmitter 214 and illustrated embodiment is biased to the DC power supply via a pull-up resistor 216, with the reference oscillator 212 configured to sink current from the DC power supply through the light transmitter 214 in accordance with the reference oscillation signal output from the reference oscillator 212. It is to be understood that the present disclosure is not limited to this configuration for generating light energy in accordance with the reference oscillation signal. For instance, the reference oscillator 212 may be operable to source current from the DC power supply to the light transmitter 214 for generation of light energy therefrom. In the illustrated embodiment, the reference oscillator 212 may be a 24 MHz oscillator with a frequency stability of about 10 ppm. It is to be understood that the frequency of the reference oscillator 212 or the frequency stability of the reference oscillator 212, or both, may vary depending on the application.

The system 200 may include a light transmissive medium 202 configured to enable transmission of light energy from the master device 210 to a slave device 220. The light transmissive medium 202 in the illustrated embodiment is a light transmissive fiber (e.g., optical fiber) capable of enabling transmission of light energy from the light transmitter 214 to a light receiver 224 of the slave device 220. The light transmissive medium 202 may vary depending on the application, and is not limited to a fiber construction. For instance, the light transmissive medium may correspond to a gas, such as atmospheric air disposed between the master device 210 and the slave device 220.

As described herein, the system 200 is not limited to transmission of light energy from the master device 210 to a single slave device 220. In other words, although the system 200 is depicted in illustrated embodiment of FIG. 1 as transmitting light energy from the master device 210 to a single slave device 220, the system 200 is not so limited. The system 200 may be configured to enable transmission of light energy from the master device 210 to a plurality of slave devices 220.

In one embodiment, the light transmissive medium 202 may be shared by the plurality of slave devices 220. For instance, all of the plurality of slave devices 220 may receive light energy transmitted from the master device 210 via a light transmissive medium 202 in the form of atmospheric air. Alternatively, the light transmissive medium 202 may be an optical fiber routed from the master device 210 to each of the plurality of slave devices 220, with one or more of the plurality of slave devices 220 having an optical tap coupled to the optical fiber to receive light energy therefrom.

In one embodiment, the master device 210 may be configured to transmit light energy to each of a plurality of slave devices 220 via separate respective light transmissive medium 202. For instance, a first slave device 220 may receive light energy via a first light transmissive medium 202, and a second slave device 220 may receive light energy via a second light transmissive medium 202. Optionally, the first light transmissive medium 202 may be operable to facilitate transmission of light energy to the first slave device 220 and one or more additional slave devices 220 in a shared manner as described herein. Likewise, additionally or alternatively, the second light transmissive medium 202 may be operable to facilitate transmission of light energy to the second slave device 220 and one or more other slave devices 220 in a shared manner as described herein.

The slave device 220 and the illustrated embodiment of FIG. 1 includes a light receiver 224 operable to receive light energy transmitted from the master device 210 via the light transmissive medium 202. The light receiver 224 in the illustrated embodiment is provided as a PIN diode photodetector operable to convert optical signals into an electrical signal (e.g., an optical signal corresponding to the light energy transmitted from the light transmitter 214 to a current). The light receiver 224 in the illustrated embodiment is biased toward a DC power supply of the slave device 220 via a pull-up resistor 226, and is configured to conduct current in response to light energy received via the light transmissive medium 202. Current conducted through the pull-up resistor 226 may facilitate injection of a timing signal into an oscillation circuit 221 as described herein to facilitate substantially locking a frequency of the oscillation circuit 221 to a frequency of the reference oscillation signal. For instance, a voltage signal present between the light receiver 224 and the pull-up resistor 226 may be supplied to the oscillation circuit 221 via a decoupling capacitor 228. It is to be understood that the light receiver 224 may be configured in a different manner for facilitating injection of the timing signal into the oscillation circuit 221, including, for example, an output of the light receiver 224 being directly coupled to the decoupling capacitor 228 for injection of the timing signal into the oscillation circuit 221.

The timing signal generated by the light receiver 224 may correspond to the light energy received by the light receiver 224 and transmitted by the light transmitter 214. In this way, the timing signal may correspond to the reference oscillation signal output from the reference oscillator 212.

The oscillation circuit 221 in the illustrated embodiment includes an oscillator 230, first and second tuning capacitors 236, 238, and amplifier 232, and a feedback resistor 234 for the amplifier 232. The oscillation circuit 221 may be configured to generate a clock signal CS based on an oscillation signal generated by the oscillator 230. The amplifier 232 may be configured for operation in a gain limited mode in an inverted configuration. The amplifier 232 and oscillator 230, in conjunction with the timing signal injected by the light receiver 224, may be configured as a super-regenerative circuit capable of locking the oscillator 230 to the incoming signal received from the reference oscillator 212 via the transmissive medium 202.

The oscillator 230 may be a crystal oscillator configured to generate an oscillation signal based on mechanical vibration of the crystal oscillator. As described herein, the timing signal injected into the oscillation circuit 221 may facilitate aligning a frequency of the mechanical vibration to the reference oscillation signal. For instance, injection of the timing signal into the oscillation circuit 221 may facilitate locking the frequency of the mechanical vibration to the reference oscillation signal of the reference oscillator 212, which is received via transmission of light energy from the master device 210 in the illustrated embodiment.

The first and second tuning capacitors 236, 238 may be specified by the manufacturer of the oscillator 230. However, as described herein, the timing signal injected oscillation circuit 221 may facilitate tuning the oscillator 230 to operate substantially at the same frequency as the reference oscillation signal output from the reference oscillator 212. As a result, adjustment or selection of the first and second tuning capacitors may be implemented to coarsely align with or approximate a frequency of the reference oscillator 212, with fine alignment or substantial locking with the reference oscillation signal being achieved via injection of the timing signal.

In one embodiment, the first and second tuning capacitors 236, 238 may be variable, such that a controller (not shown) may adjust a capacitance of one or both of the first and second tuning capacitors 236, 238 during operation. As described herein, because an oscillation output of the oscillator 230 may correspond substantially to the reference oscillation signal via injection of the timing signal, adjustment of the first and second tuning capacitors 236, 238 may have little to no effect on a frequency of the oscillator 230. However, adjustment of the first and second tuning capacitors 236, 238 may be utilized to adjust a phase of the oscillation output of the oscillator 230. For instance, the phase of the oscillation output may be varied in one embodiment in order to align a phase of the oscillation output with a phase of the reference oscillator output.

In the illustrated embodiment of FIG. 1, the timing signal injected into the oscillator output of the oscillator 230 is depicted in further detail relative to the oscillator output. The oscillator output in the illustrated embodiments is gained limited by the amplifier 232. As described herein, because the oscillator output is gained limited, injection of the timing signal may initiate a transition of the oscillation signal sooner or later than would otherwise occur, pushing or pulling the oscillation signal toward substantial alignment with the reference oscillation signal.

As can be seen in the illustrated embodiment, the timing signal may be injected into the oscillation output of the oscillator 230. Transitions of the timing signal are depicted occurring sooner than the oscillation signal respective durations T1, T2. The oscillation signal is depicted in the illustrated embodiment as moving toward alignment with the timing signal injected into the oscillation circuit 221 by the light receiver 224. For purposes of disclosure, alignment between the injected timing signal and the oscillation output of the oscillator 230 is shown over three periods. In practice, alignment may occur over many more periods. It is to be understood that injection of the timing signal into the oscillation circuit 221 may continuously push or pull the oscillation output of the oscillator 230 toward substantial alignment with the reference oscillation signal. In this way, the oscillation output of the oscillator 230 may be substantially locked in frequency with the reference oscillator 212 via continuous injection of the timing signal into the oscillator circuit 221. The frequency lock may be achieved in an open loop manner such that adjustment of the oscillation signal of the oscillator 230 may occur without affecting the reference oscillation signal output from the reference oscillator 212 and without actively controlling the reference oscillation signal output from the reference oscillator 212.

The peak value (e.g., peak voltage) of the timing signal injected into the oscillation circuit 221 may be determined as a function of a peak output of the oscillator signal and a frequency stability of the oscillator 230. In the illustrated embodiment, the peak value of the timing signal injected into the oscillation circuit corresponds to the peak output of the oscillator signal multiplied times the frequency stability in parts per million (PPM). As an example, for a 100 mV peak oscillator output and a 10 PPM oscillator 230, the peak value of the timing signal injected into the oscillation circuit 221 that is sufficient to achieve a frequency lock is 1 μV.

In one embodiment, the slave device 220 may be operated in a low-power or sleep mode while the master device 210 continues to transmit light energy via the light medium 202. In a low-power mode, the slave device 220 may provide power to the light receiver 224 and the oscillation circuitry 221 such that the clock signal CS output from the oscillation circuitry 221 is substantially locked in frequency to the reference oscillator 212, despite other components of the slave device being unpowered.

In an alternative embodiment, the light receiver 224 and the oscillation circuitry 221 may be unpowered in a low-power or sleep mode for the slave device 220. The master device 210 in this configuration may also continue to transmit light energy via the light medium 202. However, the present disclosure is not so limited—the master device 210 may selectively transmit light energy via the light medium 202 in accordance with the reference oscillator output, such as while the slave device 220 is awake and not while the slave devices sleep. In an embodiment in which the oscillation circuitry 221 and the light receiver 224 are unpowered in a low-power or sleep mode, the slave device 220 may awake from the low-power or sleep mode to an active mode and begin supply power to the oscillation circuitry 221 and the light receiver 224. The oscillation circuitry 221 may initially be operating at a frequency slightly different from the reference oscillator 212; however, as described herein, the oscillation circuitry 221 in conjunction with the light receiver 224 may substantially lock, over the course of a plurality of cycles, with the reference oscillator 212 via injection of the timing signal output from the light receiver 224 in response to light energy transmitted from the master device 210. With this low-power mode of operation and the ability to substantially lock to the reference oscillator 212 after awakening from the low-power mode or a sleep state, the slave device 100 may avoid continuously powering the oscillation circuitry and/or the light receiver 224 in order to lock the oscillation circuitry to the frequency of the reference oscillator 212.

Figure 2:
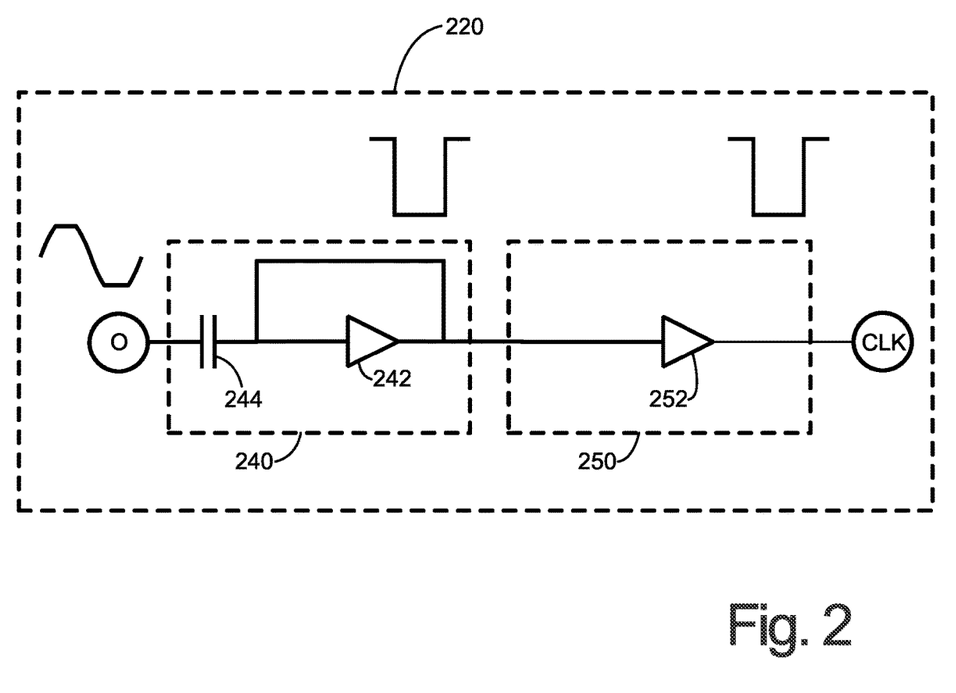
FIG. 2 shows a plurality of amplifier stages for a system in accordance with one embodiment.

Turning to the illustrated embodiment of FIG. 2, the slave device 220 may include one or more amplifier stages coupled to the oscillation circuit 221 and operable to generate a clock signal CLK, which can be supplied to one or more components of the slave device 220. Alternatively, the slave device 222 may be absent in one or more such amplifier stages such that the clock signal CS corresponds to the clock signal CLK supplied to one or more components of the slave device 220.

The one or more amplifier stages of the slave device 220 in the illustrated embodiment may provide one or more layers of isolation between components of the slave device 220 and the oscillation circuitry 221. It is noted that the oscillation circuitry 221 in the illustrated embodiment includes an amplifier directly coupled to the oscillator 230. Accordingly, the amplifier stages described in conjunction with the illustrated embodiment of FIG. 2—although described as first and second stages—may be second and third stages relative to the amplifier stage of the oscillation circuitry 221.

In this way, components of the slave device 220 that are coupled to the clock signal CLK can be substantially prevented from affecting operation of the oscillation circuitry 221. In practice, the one or more amplifier stages may substantially limit impact on oscillation circuitry 221 by components of the slave device 222 coupled to the clock signal CLK; however, it is to be understood, depending on the construction of the one or more amplifier stages, there is a potential for such components to have a trivial or minor impact on the oscillation circuitry 221. Any such effects may be substantially negated by injecting the timing signal into the oscillation circuitry 221 as described herein, where the injected timing signal is based on light energy received from the master device 210.

In the illustrated embodiment, the one or more amplifier stages includes a first amplifier stage 240 directly coupled to the oscillation circuitry 221 to receive the clock signal CS there from. The first amplifier stage 240 may be configured for linear mode operation or near linear mode operation. The first amplifier 240 may be operable to generate and output a clock signal based on the clock signal CS, where transitions of the clock signal output from the first amplifier 240 occur faster than the clock signal CS output from the oscillation circuitry 221. In other words, the switching speed of the clock signal output from the first amplifier 240 is greater than the switching speed of the clock signal CS output from the oscillation circuitry 221.

The first amplifier stage 240 in the illustrated embodiment includes a decoupling capacitor 244 and an amplifier 242 configured in an inverted mode. The decoupling capacitor 244 may provide DC isolation between the clock signal CS output from the oscillation circuitry 221 and the input to the amplifier 242.

In the illustrated embodiment, the clock signal output from the first amplifier stage 240 may be supplied as an input to a second amplifier stage 250. The second amplifier stage 250 may be configured for operation in non-linear mode, with a switching speed of the clock signal CLK output from the second amplifier stage 250 being equal to or faster than the clock signal output from the first amplifier stage 240. The second amplifier stage 250 may include an amplifier 252 configured for nonlinear operation.

II. Alternative Embodiment

Figure 3:
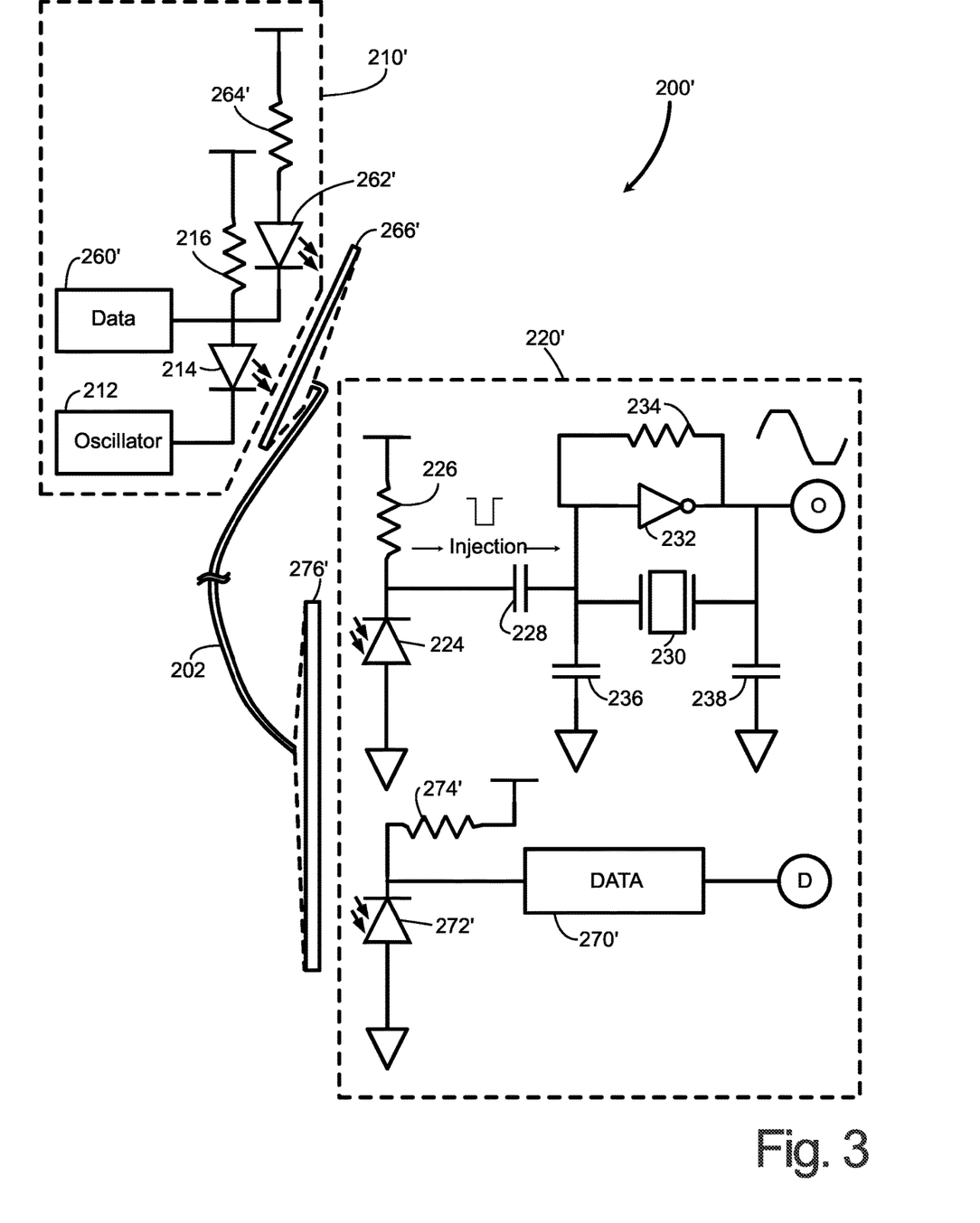
FIG. 3 shows an alternative system in accordance with one embodiment.

An alternative system in accordance with one embodiment is depicted in FIG. 3 and generally designated 200'. The system 200' is similar in many respects to the system 200, including a master device 210', a slave device 220', oscillation circuitry 221, and a light receiver 224 operable to inject a timing signal into the oscillation circuitry 221 in order to facilitate substantially aligning the frequency of the clock signal CS with the frequency of the oscillator 212. For purposes of disclosure, the system 200' includes several components identified by the same reference number as the system 200. Such components of the system 200' are substantially similar to the counterpart of the system 200.

The system 200' in the illustrated embodiment depicts a communication interface operable to transmit data between the master device 210' and the slave device 220'. The communication interface may be utilized for transmitting data from the master device 210' to the slave device 220'. Additionally, or alternatively, the communication interface may be utilized for transmitting data from the slave device 220' to the master device 210'. The communication interface may facilitate transfer of data via the light transmissive media 202, which may be similar to the light transmissive media described in conjunction with the system 200'.

The communication interface in the illustrated embodiment of FIG. 3 includes data transmission circuitry 260' operable to control transmission of light energy from a data transmitter 262' (e.g., a laser diode similar to the light transmitter 214). The data transmitter 262', similar to the light transmitter 214, may be coupled to a pull-up resistor 264' that biases the data transmitter 262 toward a supply side of a DC source. The data transmission circuitry 260' may be configured to selectively sink current through the data transmitter 262' in accordance with data to be transmitted via the transmissive medium 202. The data transmission circuitry 260' may be configured to encode data received for transmission from circuitry of the master device 210' in a variety of ways depending on the application. For example, the data transmission circuitry 260' may encode the data in accordance with non-return-to-zero (NRZ) serial data.

The master device 210' may include a transmission interface 266' operably coupled to the light transmitter 214 and the data transmitter 262' to facilitate transmission of light energy to the transmissive medium 202 in a shared manner. In the illustrated embodiment, the light transmitter 214 and the data transmitter 262' are operable to transmit light energy according to different spectrums (e.g., different colors). This way, the transmissive medium 202 may be shared for transmission of light energy in accordance with the reference oscillator 212 and in accordance with data transmitted by the data transmission circuitry 260'.

The slave device 220' in the illustrated embodiment includes the oscillation circuitry 221 as described herein, as well as a data receiver 272' and data reception circuitry 270'. The data receiver 272' may be similar to the light receiver 224 (e.g., a PIN diode photodetector) such that the data receiver 272' is operable to conduct current in response to light energy received from the data transmitter 262' via the transmissive medium 202. The data receiver 272' may be biased toward a supply side of a DC source via a pull-up resistor 274', similar in operation to the pull-up resistor 226. The data receiver 272' may be configured to conduct current source from the DC source via the pull-up resistor 274' in response to receipt of light energy as described herein.

The slave device 220' in the illustrated embodiment includes diffraction grating 276' operable to facilitate separation of light energy received via the transmissive medium 202 into first and second light signals respectively directed to the light receiver 224 and the data receiver 272'. For instance, the data transmitter 262 may transmit light energy in accordance with a different spectrum from a spectrum utilized for transmission of light energy by the light transmitter 214. The diffraction grating 276' may separate these different spectrums of light energy and facilitate directing these different spectrums of light respectively to the light receiver 224 and the data receiver 272'. This way, by separating different spectrums of light with the diffraction grating 276', light energy transmitted from the light transmitter 214 may be directed to the light receiver 224 separate from the light generated by the data transmitter 262' Likewise, light energy transmitted by the data transmitter 262' may be directed to the data receiver 272 separate from the light generated by the light transmitter 214.

The data receiver circuitry 270' in the illustrated embodiment may be operable to decode a data signal generated by the data receiver 272' in accordance with light energy transmitted by the data transmitter 262' and received via the transmissive medium 202. It is to be understood that multiple types of data transmitters or data receivers, or both, may be incorporated into the master device 210 or the slave device 220, or both.

III. Location System Overview

Figure 4:
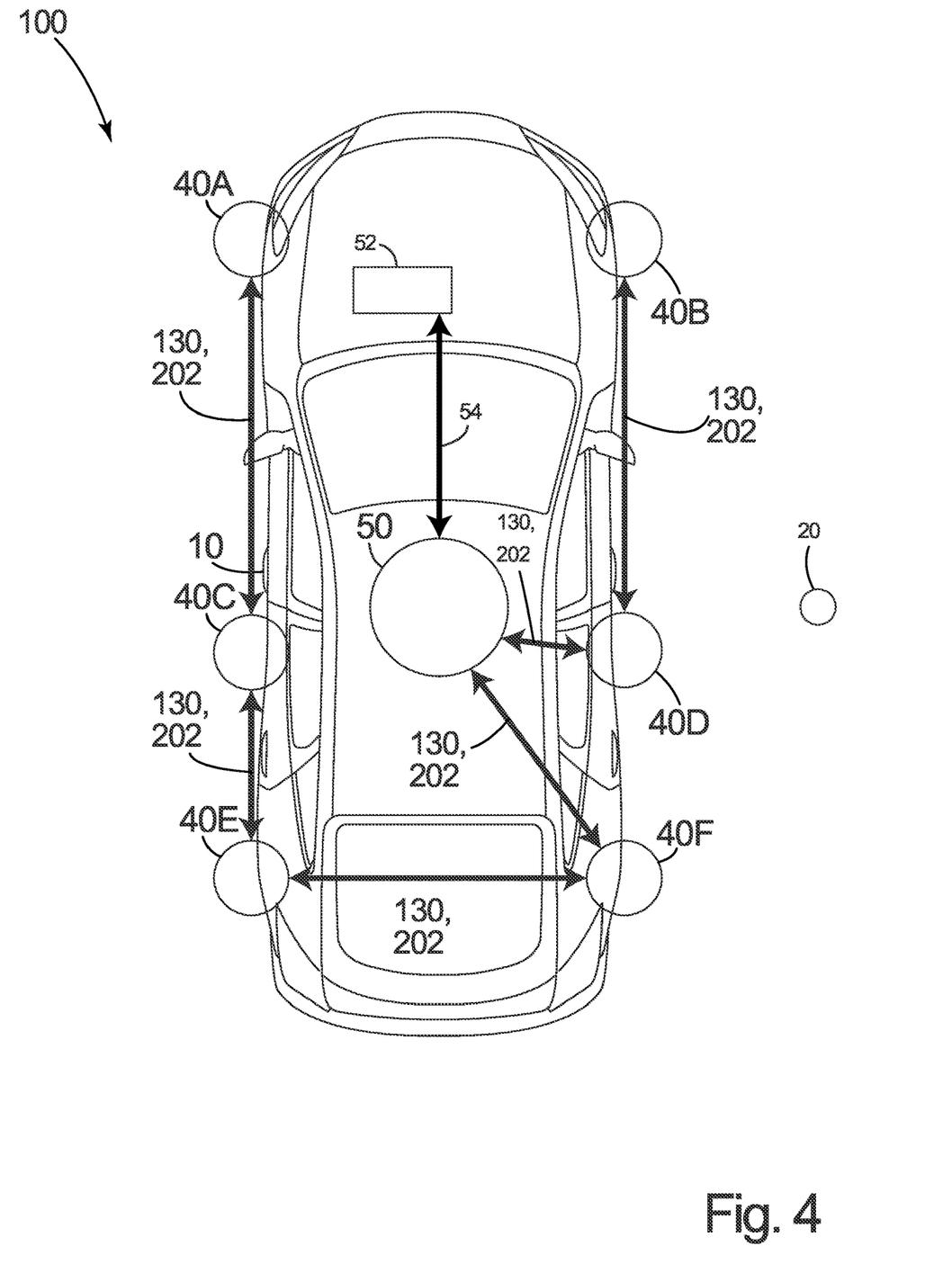
FIG. 4 shows a system for determining a location of a portable device in accordance with one embodiment.

A system in accordance with one embodiment is shown in the illustrated embodiment of FIG. 4 and generally designated 100. The system 100 may include one or more system components as outlined herein. A system component may be a user or an electronic system component, which may be the remote device 20, a sensor 40, or an object device 50, or a component including one or more aspects of these devices. Several aspects of the remote device 20, the sensor 40, and the object device 50 may be similar. The primary difference between the object device and the sensor pertains to the role of the device within the system 100—e.g., the object device 50 may transmit data to and receive data from the sensor 40 via a communication link 130. The object device 50 may direct operation of the sensor 40 by transmitting data to the sensor 40. The object device 50 may obtain, via the communication link 130, information from the sensor 40 indicative of a position of the remote device 20 relative to the sensor 40 and/or the object 10. One or more or all features described in connection with the sensor 40 depicted in the illustrated embodiments may be incorporated into the remote device 20.

In one embodiment, the sensor 40 and the object device 50 may form at least part of a system 100 disposed on an object 10, such as a vehicle or a building. The object device 50 may be communicatively coupled to one or more systems of the object 10 to control operation of the object 10, to transmit information to the one or more systems of the object 10, or to receive information from the one or more systems of the object 10, or a combination thereof. For instance, the object 10 may include an object controller 52 configured to control operation of the object 10. The object 10 may include one or more communication networks, wired or wireless, that facilitate communication between the object controller 52 and the object device 50. The communication network 54 for facilitating communications between the object device 50 and the object controller 52 may be a CAN bus; however, it is to be understood that the communication network is not so limited. The communication network 54 may be any type of network, including a wired or wireless network, or a combination of two or more types of networks.

The one or more sensors 40 may be disposed in a variety of positions on the object 10, such as the positions described herein, including for instance, one or more sensors 40 in the door panel and one or more other sensors in the B pillar.

The object device 50 and the one or more sensors 40 may be powered via a power bus 120. The power bus 120 may be daisy chained from one device to the next as depicted in the illustrated embodiment of FIG. 5. Alternatively, the power bus 120 may be provided in the form of a star connection with power being supplied from one location to multiple locations via separate connections. Power supply and architecture is not limited to any one type—for instance, power may be distributed via both daisy chain and star connection configurations.

The system 100 in the illustrated embodiment may be configured to determine location information in real-time with respect to the remote device 20. In the illustrated embodiment of FIGS. 4 and 5, a user may carry the remote device 20 (e.g., a smartphone). The system 100 may facilitate locating the remote device 20 with respect to the object 10 (e.g., a vehicle) in real-time with sufficient precision to determine whether the user is located at a position at which access to the object 10 or permission for an object 10 command should be granted.

Figure 5:
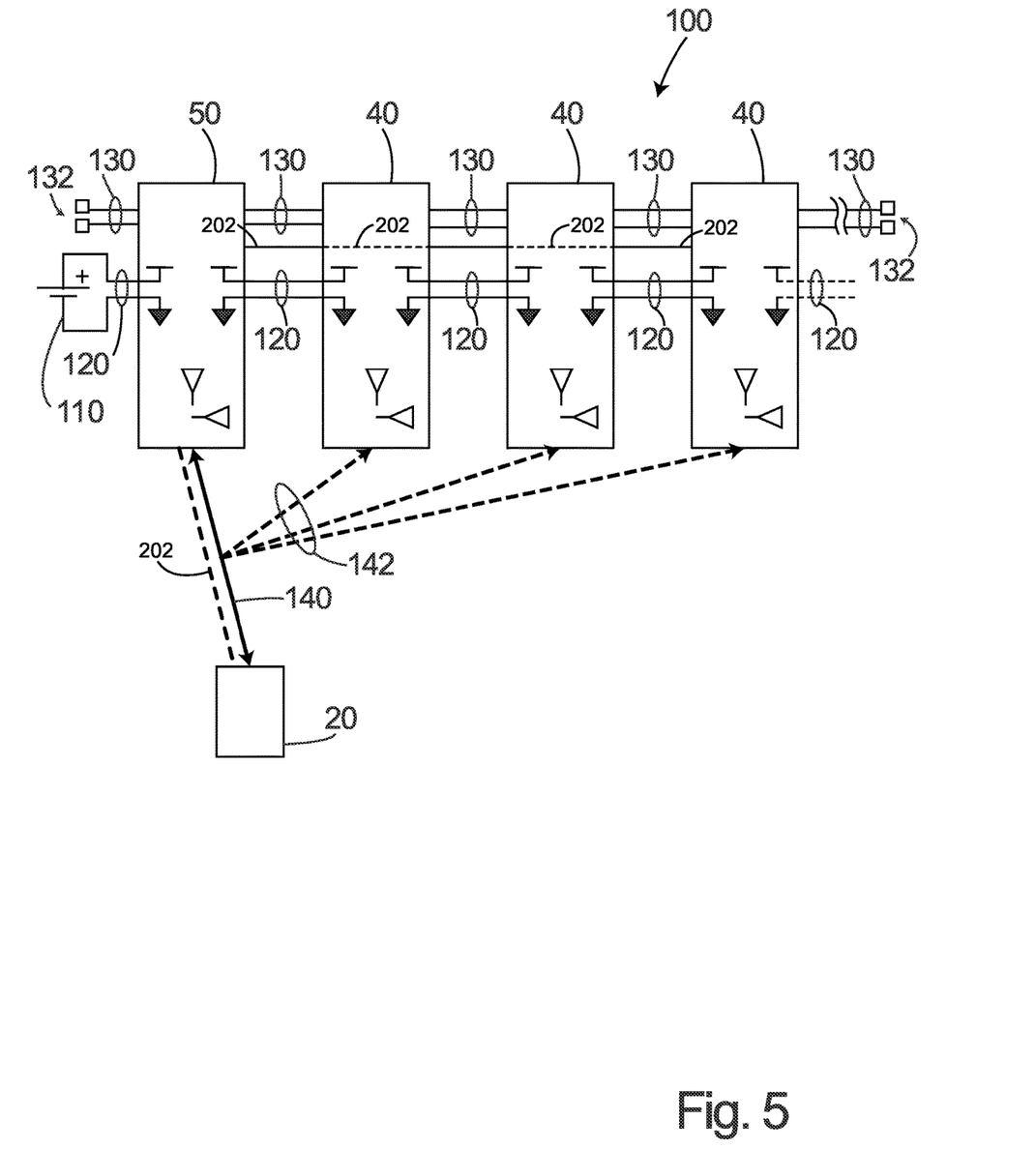
FIG. 5 shows a representative view of a system for determining a location of a portable device in accordance with one embodiment.

For instance, in an embodiment where the object 10 is a vehicle, the system 100 may facilitate determining whether the remote device 20 is outside the vehicle but in close proximity, such as within 5 feet, 3 feet, or 2 feet or less, to the driver-side door 15. This determination may form the basis for identifying whether the system 100 should unlock the vehicle. On the other hand, if the system 100 determines the remote device 20 is outside the vehicle and not in close proximity to the driver-side door (e.g., outside the range of 2 feet, 3 feet, or 5 feet), the system 100 may determine to lock the driver-side door. As another example, if the system 100 determines the remote device 20 is in close proximity to the driver-side seat but not in proximity to the passenger seat or the rear seat, the system 100 may determine to enable mobilization of the vehicle. Conversely, if the remote device 20 is determined to be outside close proximity to the driver-side seat, the system 100 may determine to immobilize or maintain immobilization of the vehicle.

The object 10 may include multiple object devices 50 or a variant thereof, such as an object device 50 including a sensor 40 coupled to an antenna array, in accordance with one or more embodiments described herein. The object device 50 may be configured to communicate directly with one or more sensors 40 via the communication link 130, which as described herein, may include one or more interfaces, such as the communication interface described herein with respect to the system 200'. The one or more interfaces may be established via one or more physical mediums.

In the illustrated embodiment of FIG. 5, the communication link 130 is distributed from one device to another and includes a terminator 132 at each end. The communication link 130 among the devices may be a shared link or a separate link for each device, or a combination thereof. For instance, the communication link 130 may be shared among two or more devices as depicted, and additionally or alternatively, the communication link 130 may be established separately from one device to another device. A device may communicate via more than one separate communications line 130, and may be configured to relay communications from one communication link 130 to another communication link 130.

In addition to or alternative to one or more location techniques described herein, micro-location of the remote device 20 may be determined in a variety of ways, such as using information obtained from a global positioning system, one or more signal characteristics of communications from the remote device 20, and one or more sensors (e.g., a proximity sensor, a limit switch, or a visual sensor), or a combination thereof. An example of microlocation techniques for which the system 100 can be configured are disclosed in U.S. Nonprovisional patent application Ser. No. 15/488,136 to Raymond Michael Stitt et al., entitled SYSTEM AND METHOD FOR ESTABLISHING REAL-TIME LOCATION, filed Apr. 14, 2017—the disclosure of which is hereby incorporated by reference in its entirety.

In the illustrated embodiment of FIGS. 4-5, the object device 50 (e.g., a system control module (SCM)) and a plurality of sensors 40 (each coupled to an antenna array) may be disposed on or in a fixed position relative to the object 10. Example use cases of the object 10 include the vehicle identified in the previous example, or a building for which access is controlled by the object device 50.

The remote device 20 may communicate wirelessly with the object device 50 via a communication link 140, such as a BLE communication link or an Ultra Wideband (UWB) communication link. The plurality of sensors 40 may be configured to sniff the communications of the communication link 140 between the remote device 20 and the object device 50 as shown in phantom lines 142. Based on the sniffed communications, a sensor 40 may determine one or more signal characteristics of the communications as described herein, such as a signal strength, time of arrival, time of flight, angle of arrival, or a combination thereof. The determined signal characteristics may be communicated or analyzed and then communicated to the object device 50 via the communication link 130 separate from the communication link 140 between the remote device 20 and the object device 50.

Additionally, or alternatively, the remote device 20 may establish a direct communication link with one or more of the sensors 40, and the one or more signal characteristics may be determined based on this direct communication link. The direct communication link may be established according to the BLE protocol; however, the present disclosure is not so limited—the direct communication link may be any type of link or links, including Ultra Wideband (UWB).

It is to be understood that an object 10, such as a vehicle, may include a number of sensors 40 that can be greater than or less than the number shown in the illustrated embodiments of FIGS. 4 and 5. Depending on the implementation, some number of sensors 40 may be integrated in a vehicle.

Additional or alternative types of signal characteristics may be obtained to facilitate determining position according to one or more algorithms, including a distance function, trilateration function, a triangulation function, a lateration function, a multilateration function, a fingerprinting function, a differential function, a time of flight function, a time of arrival function, a time difference of arrival function, an angle of departure function, a geometric function, or any combination thereof.

In the illustrated embodiments of FIGS. 4 and 5, a transmission medium 202 is provided between the object device 50 and one or more sensors 40. The transmission medium 202 may enable transmission of light energy and may be substantially immune to electromagnetic interference generated by electrical components and of the object 10, such as interference generated by fast switching of wired communication interfaces, radio frequency interference, and electromechanical components of the object 10 (e.g., an engine).

The object device 50 may correspond to the master device 210, and the one or more sensors 40 may correspond to the slave device 220. The system 200 described herein may be utilized to lock a frequency of a clock signal CLK utilized in the sensor 40 with a reference oscillator 212 provided in the object device 50. This way, a clock signal utilized in the object device 50 may be substantially the same frequency as a clock signal utilized in the sensor 40. The transmissive medium 202 may be utilized by the object device 50 to facilitate locking a frequency of a clock signal CLK in multiple sensors 40, such that light energy transmitted from the light transmitter 214 may be received by multiple light receivers 224 in respective ones of the plurality of sensors 40.

Alignment of the frequency being utilized by multiple devices in the system 100 may aid avoiding complex analysis and comparisons of the one or more signal characteristics detected by multiple sensors 40 in the system. For instance, measurements with respect to time of flight can be compared with little to no regard for deviations in the frequency of one device relative to another device. By having the frequency of multiple devices being substantially the same, algorithms operable to analyze signal characteristics measured by different sensors 40 can substantially ignore effects due to frequency deviations. In one embodiment, as described herein, the phase of the clock signals CLK in multiple devices may be adjusted for alignment with a phase of the reference oscillator 212 of the master device 210. This phase alignment may further facilitate analysis and comparison of measurements obtained by sensors 40 located at different positions and operating separately from each other.

As described herein, one or more signal characteristics, such as a phase characteristic, a signal strength, time of arrival, time of flight, and angle of arrival may be analyzed to determine location information about the remote device 20 relative to the object 10, an aspect of the object 10, or the object device 50, or a combination thereof. For instance, a phase rotation of a tone transmission, and optional re-transmission, or a phase characteristic indicative of a phase rotation may form the basis for determining a distance between an object device 50 or a sensor 40 and the remote device 20. Additional examples of signal characteristics include time difference of arrival or the angle of arrival, or both, among the sensors 40 and the object device 50 may be processed to determine a relative position of the remote device 20. The positions of the one or more antenna arrays 220 relative to the object device 50 may be known so that the relative position of the remote device 20 can be translated to an absolute position with respect to the antenna arrays 220 and the object device 50.

The system 100 in one embodiment may incorporate aspects of the system 200', such as data communication capabilities that share the transmission medium 202 utilized to facilitate aligning the frequencies of oscillators within the system 100. The data communication capabilities may be provided in place of or in addition to the communication interface 130.

It is further noted that, in one embodiment, the transmission medium 202 may be atmospheric gas. The slave device 220 may correspond to the portable device 20, with the master device 210 being an object device 50 or sensor 40 disposed on the vehicle, and the light transmitter 214 transmitted light energy that is received by the portable device 20 and enables the portable device 20 to substantially align a clock signal CLK of the portable device 20 with a reference oscillator 212 of the object device 50 or sensor 40 disposed on the vehicle.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

The embodiments of the invention in which an exclusive property or privilege is claimed are defined as follows:

1. A system for generating a clock signal in a device, the system comprising:
   an optical receiver configured to receive light energy corresponding to a reference oscillation signal, the optical receiver operable to generate a receiver output based on the light energy; and
   an oscillator configured to generate an oscillating signal, the oscillator being operably coupled to the receiver output of the optical receiver, wherein the oscillating signal of the oscillator is substantially locked to the reference oscillation signal received via the optical receiver, wherein the oscillator is a crystal oscillator.

2. The system of claim 1 comprising an amplifier operably coupled to the oscillator, the amplifier configured to generate the clock signal based on the oscillating signal generated by the oscillator.

3. The system of claim 2 wherein the amplifier includes a first amplifier stage directly connected to the oscillator and configured to generate a first amplifier output based on the oscillating signal, and wherein the amplifier includes a second amplifier stage coupled to the first amplifier stage and configured to generate a second amplifier output based on the first amplifier output such that the second amplifier output is based on the oscillating signal.

4. The system of claim 2 wherein the oscillator and the amplifier form a superregenerative receiver with respect to the receiver output that is based on the reference oscillation signal.

5. The system of claim 1 wherein a mechanical vibration of the crystal oscillator is varied based on the receiver output such that the mechanical vibration of the crystal oscillator is locked to the reference oscillation signal.

6. The system of claim 1 comprising:
a reference oscillator operable to generate the reference oscillation signal;
an optical transmitter operably coupled to the reference oscillator, the optical transmitter arranged to generate the light energy corresponding to the reference oscillation signal;
wherein the optical receiver and the oscillator are disposed in the device; and
wherein the reference oscillator and the optical transmitter are disposed in a remote device that is remote from the device, the optical receiver, and the oscillator.

7. The system of claim 6 comprising a fiber medium operably coupled between the optical transmitter and the optical receiver.

8. The system of claim 6 wherein the oscillating signal of the oscillator is substantially locked to the reference oscillation signal in an open loop manner such that the reference oscillator is unaffected by operation of the oscillator.

9. The system of claim 1 comprising a slave device including the optical receiver and the oscillator, and wherein the system includes a plurality of such slave devices each capable of locking with the reference oscillation signal.

10. A slave device that is remote from a master device, the slave device comprising:
an optical receiver configured to receive light energy corresponding to a reference oscillation signal generated by the master device, the optical receiver operable to generate a receiver output based on the light energy; and
an oscillator configured to generate an oscillating signal, the oscillator being operably coupled to the receiver output of the optical receiver, wherein the oscillating signal of the oscillator is substantially locked to the reference oscillation signal received via the optical receiver and generated remotely from the optical receiver, wherein the oscillator is a crystal oscillator.

11. The slave device of claim 10 comprising an amplifier operably coupled to the oscillator, the amplifier configured to generate a clock signal based on the oscillating signal generated by the oscillator.

12. The slave device of claim 11 wherein the amplifier includes a first amplifier stage directly connected to the oscillator and configured to generate a first amplifier output based on the oscillating signal, and wherein the amplifier includes a second amplifier stage coupled to the first amplifier stage and configured to generate a second amplifier output based on the first amplifier output such that the second amplifier output is based on the oscillating signal.

13. The slave device of claim 11 wherein the oscillator and the amplifier form a superregenerative receiver with respect to the receiver output that is based on the reference oscillation signal.

14. The slave device of claim 10 wherein a mechanical vibration of the crystal oscillator is varied based on the receiver output such that the mechanical vibration of the crystal oscillator is locked to the reference oscillation signal.

15. The slave device of claim 10 wherein the optical receiver is operably coupled to a fiber medium to receive the light energy transmitted by the master device.

16. The slave device of claim 10 wherein the oscillating signal of the oscillator is substantially locked to the reference oscillation signal in an open loop manner such that the reference oscillation signal is unaffected by operation of the oscillator.

17. A method of synchronizing an oscillation signal to a reference oscillation signal that is generated remotely from the oscillation signal, the method comprising:
receiving light energy corresponding to the reference oscillation signal;
generating a receiver output based on the light energy; and
substantially locking an oscillator signal to the reference oscillation signal; and
generating the oscillator signal via a crystal oscillator.

18. The method of claim 17 comprising amplifying the oscillator signal to yield a clock signal.

* * * * *